United States Patent
Ward et al.

(10) Patent No.: US 9,263,659 B2
(45) Date of Patent: Feb. 16, 2016

(54) SYSTEM AND METHOD FOR THERMAL PROTECTION OF AN ELECTRONICS MODULE OF AN ENERGY HARVESTER

(75) Inventors: Marcus S. Ward, Salem, OR (US); Mark Hauck, Corvallis, OR (US)

(73) Assignee: Perpetua Power Source Technologies, Inc., Corvallis, OR (US)

(*) Notice: Subject to any disclaimer, the term of this patent is extended or adjusted under 35 U.S.C. 154(b) by 313 days.

(21) Appl. No.: 13/492,890

(22) Filed: Jun. 10, 2012

(65) Prior Publication Data

US 2012/0312345 A1 Dec. 13, 2012

Related U.S. Application Data

(60) Provisional application No. 61/520,519, filed on Jun. 10, 2011.

(51) Int. Cl.
| H01L 35/28 | (2006.01) |
| H01L 35/02 | (2006.01) |
| H05K 7/20 | (2006.01) |
| H01L 35/30 | (2006.01) |
| H01L 35/32 | (2006.01) |

(52) U.S. Cl.
CPC ............... *H01L 35/02* (2013.01); *H01L 35/28* (2013.01); *H01L 35/30* (2013.01); *H05K 7/20* (2013.01); *H01L 35/32* (2013.01)

(58) Field of Classification Search
CPC ......... H01L 35/00; H01L 35/02; H01L 35/28; H01L 35/30; H01L 35/32; H05K 7/20
See application file for complete search history.

(56) References Cited

U.S. PATENT DOCUMENTS

| 5,356,484 A * | 10/1994 | Yater et al. ............... 136/200 |
| 5,486,681 A * | 1/1996 | Dagnac et al. ........... 219/400 |
| 5,544,488 A * | 8/1996 | Reid .......................... 62/3.7 |
| 6,002,081 A | 12/1999 | Sakuragi |
| 6,172,486 B1 * | 1/2001 | Campagnuolo et al. ..... 320/141 |
| 6,294,721 B1 * | 9/2001 | Oravetz et al. ........... 136/242 |
| 6,433,268 B1 * | 8/2002 | Hausgen .................. 136/205 |
| 6,958,443 B2 | 10/2005 | Stark |
| 7,629,531 B2 | 12/2009 | Stark |
| 2002/0148236 A1 * | 10/2002 | Bell .......................... 62/3.3 |
| 2005/0126184 A1 | 6/2005 | Cauchy |
| 2006/0196534 A1 * | 9/2006 | Takada et al. ............ 136/244 |
| 2008/0110490 A1 * | 5/2008 | Duesterhoeft ............ 136/248 |

(Continued)

OTHER PUBLICATIONS

Perpetua Power Source Technologies, "Perpetua Flexible Thermoelectric Film", retrieved on May 25, 2012.

(Continued)

*Primary Examiner* — Allison Bourke
*Assistant Examiner* — Edward Schmiedel

(57) ABSTRACT

A thermoelectric energy harvesting system may include a thermoelectric generator and an electronics module. The thermoelectric generator may produce a voltage in response to a temperature difference across the thermoelectric generator and generate power when coupled to a load. The system may include a housing mounted on top of the thermoelectric generator. The housing may include a cavity containing the electronics module. The electronics module may condition the power generated by the thermoelectric generator. The cavity may be enclosed by an inner surface of the housing. A radiation shield may cover at least a portion of the inner surface and may block radiative heating of the cavity from the housing.

10 Claims, 4 Drawing Sheets

(56) References Cited

U.S. PATENT DOCUMENTS

| | | |
|---|---|---|
| 2009/0071526 A1 | 3/2009 | Parker |
| 2009/0235968 A1* | 9/2009 | Luo .............................. 136/205 |
| 2010/0139291 A1* | 6/2010 | Hofmeister et al. ............. 62/3.7 |
| 2011/0094556 A1 | 4/2011 | Stark |

OTHER PUBLICATIONS

Perpetua Power Source Technologies, "Hows It Works," retrieved on May 25, 2012.

Marlow, "EverGen Energy Harvesters," retrieved on May 8, 2012.

* cited by examiner

SYSTEM AND METHOD FOR THERMAL PROTECTION OF AN ELECTRONICS MODULE OF AN ENERGY HARVESTER

CROSS-REFERENCE TO RELATED APPLICATIONS

The present application claims priority to U.S. Provisional Application No. 61/520,519 filed on Jun. 10, 2011 and entitled METHOD AND APPARATUS TO THERMALLY PROTECT THE SENSITIVE ELECTRONICS IN AN ENCLOSED THERMOELECTRIC ENERGY HARVESTER, the entire contents of which is expressly incorporated herein by reference.

FIELD

The present disclosure relates generally to energy harvesting systems and, more particularly, to thermal management of electronic components contained in a thermoelectric energy harvesting system.

BACKGROUND

The trend towards miniaturization of microelectronic devices such as micro-sensors is necessitating the development of miniaturized power supplies. Batteries and solar cells are traditional power sources for such microelectronic devices. However, the power supplied by batteries dissipates over time requiring replacement of the batteries on a periodic basis. Solar cells, although having an effectively unlimited useful life, may only provide a transient source of power as the sun or other light sources may not always be available.

Thermoelectric generators are energy sources that convert thermal energy into electrical energy over an essentially unlimited lifetime. A thermoelectric generator produces a voltage in response to a thermal gradient across the thermoelectric generator. The thermal gradient may be provided by a heat source on one side of the thermoelectric generator and a lower-temperature heat sink on an opposite side of the thermoelectric generator. Heat from the heat source may flow through the thermoelectric generator prior to entering the heat sink where the heat may be rejected to the environment.

Certain thermoelectric energy harvesting systems may include electronic components to condition the voltage produced by the thermoelectric generator prior to delivery to a load. Electronic components may also be provided to perform application-specific functions. Electronic components typically have a maximum rated temperature up to which the electronic components may operate on a nominal basis. Approaching the maximum rated temperature of the electronic components may result in a reduction in the performance of the electronic components. Exceeding the maximum rated temperature of the electronic components may result in damage or failure of the electronic components. A failure of the electronic components may compromise the electricity-producing capability of the thermoelectric generator.

As can be seen, there exists a need in the art for a system and method of minimizing the heating of electronic components that may be included in a thermoelectric energy harvesting system.

SUMMARY

The above-noted needs associated with electronic components in energy harvesting systems are specifically addressed and alleviated by the present disclosure which provides a thermoelectric energy harvesting system having a thermoelectric generator and an electronics module. The thermoelectric generator may produce a voltage in response to a temperature difference across the thermoelectric generator which generates useful power across an electrically-connected external load. The system may include a housing mounted on top of the thermoelectric generator. The housing may include a cavity containing the electronics module. The electronics module may condition the power output of the thermoelectric generator and/or perform application-specific functions. The cavity may be enclosed by one or more inner surfaces of the housing. The system may include a radiation shield covering at least a portion of one or more of the inner surfaces. The radiation shield may prevent or reduce radiative heating of the cavity from the heat in the housing.

In a further embodiment, disclosed is a thermoelectric energy harvesting system having a thermoelectric generator producing a voltage in response to a temperature difference across the thermoelectric generator. The system may further include a housing having a cavity defined by a housing bottom upper surface and a housing side wall inner surface. The system may include a heat sink mounted on top of the housing and enclosing the cavity and having a heat sink lower surface. A radiation shield may be mounted to the housing bottom upper surface and the housing side wall inner surface for blocking or minimizing radiative heating of the cavity.

The system may include a compliant thermally-insulative layer mounted to the radiation shield. An electronics module may be mounted within the cavity on top of the compliant thermally-insulative layer. The electronics module may be configured to regulate the voltage produced by the thermoelectric generator. The electronics module may have an upper surface and a lower surface. The system may include a compliant thermal transfer pad interposed between the heat sink lower surface and the electronics module upper surface for thermal coupling therebetween. The system may additionally include a compliant thermally-conductive layer extending between the electronics module lower surface and the heat sink and forming a heat conduction path therebetween.

In a further embodiment, disclosed is a method of minimizing the heating of an electronics module in a thermoelectric energy harvesting system. The method may include the step of providing a temperature difference across a thermoelectric generator such that the thermoelectric generator produces a voltage. The method may include providing a housing mounted on top of the thermoelectric generator. The housing may have a cavity containing an electronics module. The housing may have heat flowing along a system heat path in response to the temperature difference across the thermoelectric generator. The method may further include the step of blocking radiative heat flow into the cavity using a radiation shield.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numbers refer to like parts throughout and wherein.

DETAILED DESCRIPTION

Figure 1:
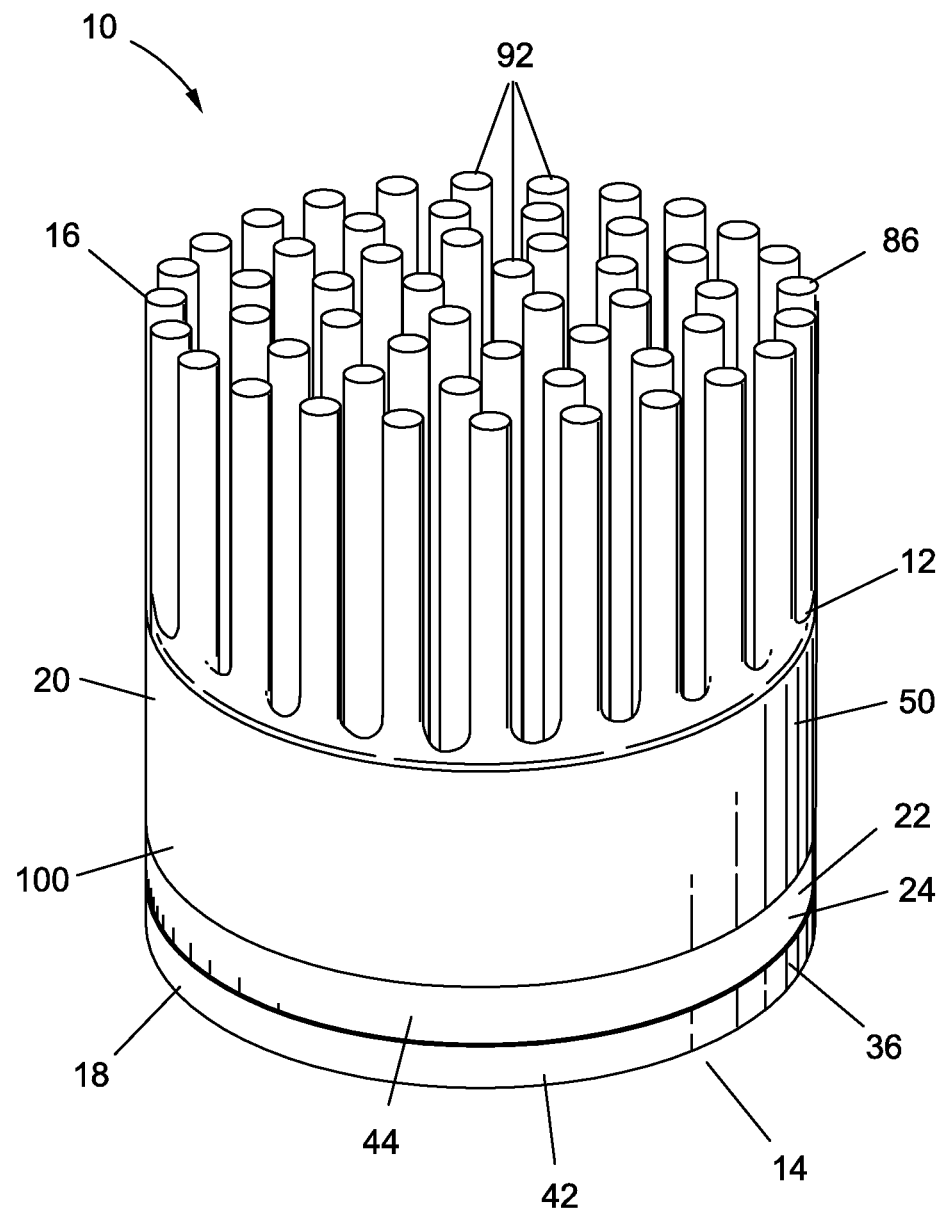
FIG. 1 is a perspective view of a thermoelectric energy harvesting system containing a thermoelectric generator and an electronics module.

Referring now to the drawings wherein the showings are for purposes of illustrating various embodiments of the present disclosure, shown in FIG. 1 is a perspective view of an embodiment of a thermoelectric energy harvesting system 10. The system 10 may contain an energy harvester 22 such as a thermoelectric generator 24. The system 10 may additionally include an electronics module 100 and a battery 118. In an embodiment, the system 10 may be configured as a field-deployable unit having the electronics module 100 and the thermoelectric generator 24 integrated into the system 10.

In an embodiment, the electronics module 100 and the battery 118 may be contained within a housing 50 of the system 10. For example, the electronics module 100 and the battery 118 may be contained within a cavity 52 (not shown) formed in the housing 50 for protecting the electronics module 100 from exposure to moisture, mechanical impact, and excessive heat. In this regard, the housing 50 may be configured to minimize thermal stress on the electronics module 100 and the battery 118. Such thermal stress may compromise the functionality or operability of heat-sensitive components such as capacitors (not shown) and/or batteries. For example, excessive heating of capacitors may reduce the capability of the capacitors to hold a charge.

The system 10 may have a system side 20, a system upper end 16, and a system lower end 18. The system 10 may include a base member 36 at the system lower end 18. The base member 36 may be mounted to a heat source 84. The thermoelectric generator 24 may be mounted on top of the base member 36. The thermoelectric generator 24 may be environmentally sealed between the housing bottom 58, the base member 36, and an insulating ring 44. The insulating ring 44 may be adhesively bonded to the base member 36 and to the housing 50 to mechanically stabilize the energy harvesting system 10 and to seal the thermoelectric generator 24 from exposure to moisture and protection from mechanical impact and other environmental effects. The thermoelectric generator 24 may produce a voltage in response to a temperature difference across the thermoelectric generator 24. The system 10 may include a heat sink 86 at the system upper end 16. The heat sink 86 may be mounted on top of the housing 50. Heat may flow along a system heat path 94 from the heat source 84 through the thermoelectric generator 24 and into the housing 50 whereupon the heat may enter the heat sink 86 for discharge into the environment by radiative heat transfer, natural convective heat transfer, or conductive heat flow from forced airflow between the cooling elements 92 and the ambient air as described in greater detail below. Although shown as having a generally cylindrical configuration, the system 10 may be provided in any size, shape, and configuration, without limitation.

Figure 2:
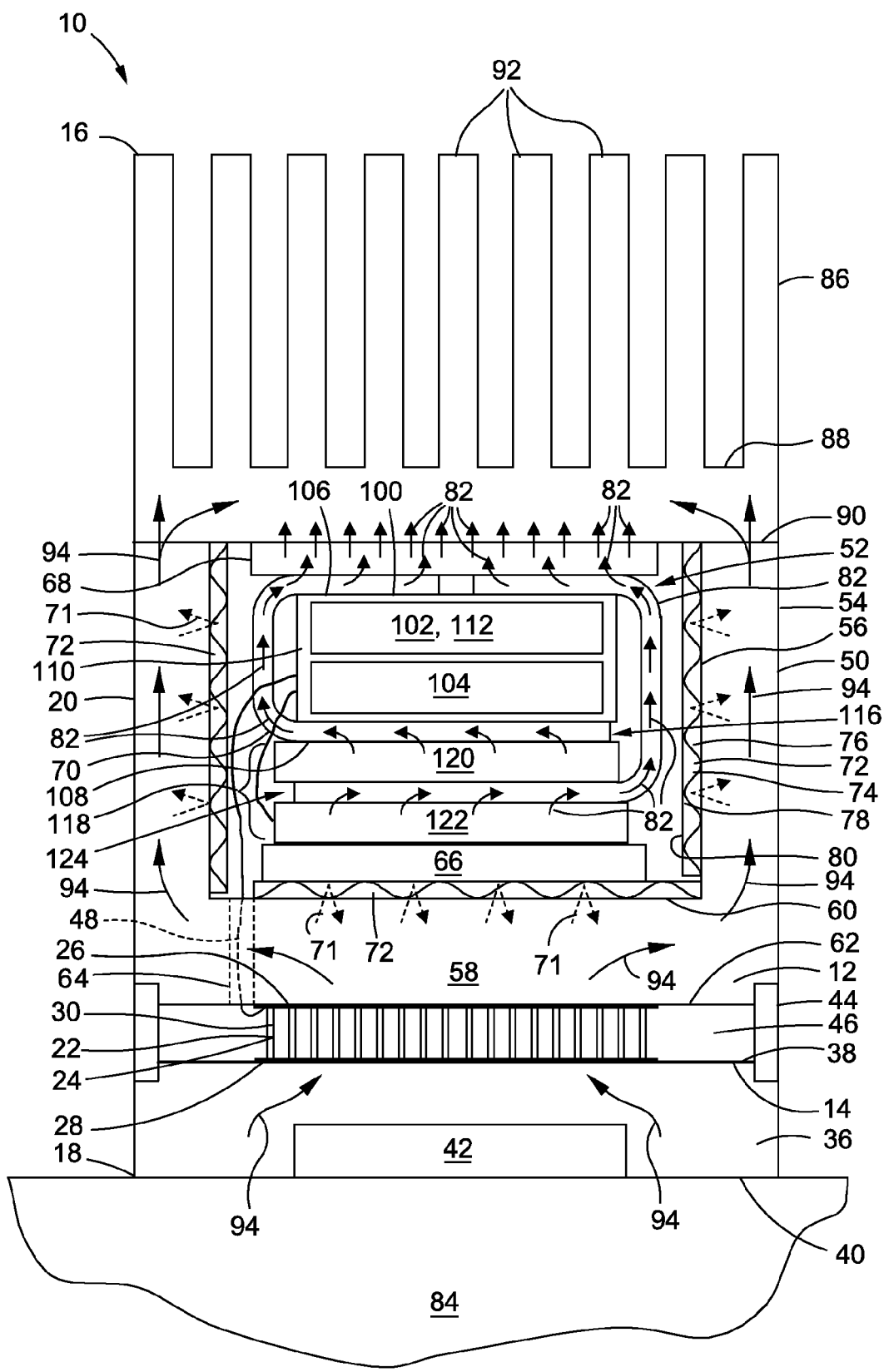
FIG. 2 is a side sectional view of an embodiment of a thermoelectric energy harvesting system having a radiation shield mounted along an inner surface of a cavity containing the electronics module and a battery.

Referring to FIG. 2, shown is a cross-sectional view of an embodiment of the thermoelectric energy harvesting system 10. The system 10 may include the base member 36 which may be configured for mounting to a heat source 84. The base member 36 may be formed of any suitable material for thermal conduction of heat from the heat source 84 into the thermoelectric generator 24. For example, the base member 36 may be formed of metallic material including, but not limited to, aluminum. The base member 36 may include a base member upper surface 38 and a base member lower surface 40. The base member lower surface 40 may be configured for mounting to a surface of a heat source 84.

In an embodiment, the base member 36 may include one or more magnets 42 which may be mounted or contained within the base member 36 to facilitate attachment of the system 10 to a heat source 84 formed at least partially of ferromagnetic material. In this regard, the magnet 42 may provide magnetic-mounting capability for industrial applications. For example, the magnet 42 may facilitate mounting of the system 10 to a motor, a bearing housing, a heated pipe, or any other system, subsystem, assembly, or structure that may provide a heat source 84 for the thermoelectric generator 24. However, the system 10 may include alternative means for attaching the base member 36 to a heat source 84 and is not limited to magnetic mounting. For example, the system 10 may include one or more mechanical features (not shown) for mechanically coupling the system 10 to a heat source 84.

The system 10 may include a thermoelectric generator 24 that may be coupled to the base member 36. For example, the thermoelectric generator 24 may be mounted on top of the base member 36. The thermoelectric generator 24 may include a thermoelectric generator upper surface 26 and a thermoelectric generator lower surface 28 which may comprise upper and lower heat couple plates (not shown) for the thermoelectric generator 24. The thermoelectric generator 24 may be positioned between the base member 36 and the housing 50. In an embodiment, the thermoelectric generator lower surface 28 may be mounted in contacting relation to the base member upper surface 38. The thermoelectric generator upper surface 26 may be mounted in contacting relation to a housing bottom lower surface 62. Thermal interface material (not shown) comprising highly-thermally conductive adhesive, grease, paste, epoxy, or other highly-thermally conductive material may be included between the thermoelectric generator lower surface 28 and the base member upper surface 38 and between the thermoelectric generator upper surface 26 and the housing bottom lower surface 62 to prevent or minimize air gaps or voids between the thermoelectric generator upper and lower surface 26, 28 and the base member upper surface 38 and the housing bottom lower surface 62 to reduce thermal resistance therebetween. The thermoelectric generator 24 may be configured to produce a voltage in response to a temperature difference across a hot side 14 and a cold side 12 of the thermoelectric generator 24.

The thermoelectric generator 24 may be configured in an in-plane configuration or in a cross-plane configuration. In an embodiment of an in-plane configuration, the thermoelectric generator 24 may be formed of a thin semiconductor film or substrate arranged in a coiled or spiral configuration and having a plurality of thermocouples similar to the arrangement disclosed in U.S. Pat. No. 7,629,531 entitled IMPROVED LOW POWER THERMOELECTRIC GENERATOR and issued on Dec. 8, 2009 to Stark, the entire contents of which is incorporated by reference herein. In another embodiment of an in-plane configuration, the thermoelectric generator 24 may be formed of a plurality of semiconductor films or substrates arranged in a stacked formation similar to the arrangement disclosed in U.S. Pat. No. 6,958,443 entitled LOW POWER THERMOELECTRIC GENERATOR and issued on Oct. 25, 2005 to Stark et al., the entire contents of which is incorporated by reference herein. In a further embodiment, the thermoelectric generator 24 may be configured as a planar thermoelectric generator (not shown) similar to the arrangement disclosed in U.S. Patent Publication No. 2011/0094556 entitled PLANAR THERMOELECTRIC GENERATOR and published on Apr. 28, 2011 to Stark, the entire contents of which is incorporated by reference herein. However, the thermoelectric generator 24 may be provided in any one of a variety of sizes, shapes, and configurations, without limitation, and is not limited to an in-plane configuration.

In FIG. 2, shown is an embodiment of the system 10 implementing one type of cross-plane thermoelectric generator 24. The system 10 may include the housing 50 that may be thermally coupled to the thermoelectric generator upper surface 26 as indicated above. As indicated above, the housing 50 may be mechanically coupled to the base member 36 by means of an insulating ring 44 that may extend around a circumference of the housing 50 and the base member 36. The insulating ring 44 may be formed of material having a relatively low thermal conductivity such that a substantial majority of heat from the heat source 84 flows into the base member 36 and through the thermoelectric generator 24 from the thermoelectric generator lower surface 28 to the thermoelectric generator upper surface 26 and into the housing 50. In the embodiment shown, the thermoelectric generator 24 may be sized and configured such that an annular gap 46 is defined between the thermoelectric generator sides 30 and the insulating ring 44. The annular gap 46 may minimize the heat transfer from the base member 36 to the housing 50.

The housing 50 may include the housing side wall 54 and the housing bottom 58. The housing bottom 58 may include a housing bottom upper surface 60 and a housing bottom lower surface 62. The housing bottom lower surface 62 may be in contact with the thermoelectric generator upper surface 26 as indicated above. The housing side wall 54 may include a housing side wall inner surface 56. The housing bottom upper surface 60 and the housing side wall inner surface 56 may define the cavity 52 of the housing 50. The housing 50 may be formed of a relatively highly thermally conductive material such as a metallic material. For example, the housing 50 may be formed of aluminum or other thermally conductive material.

Figure 3:
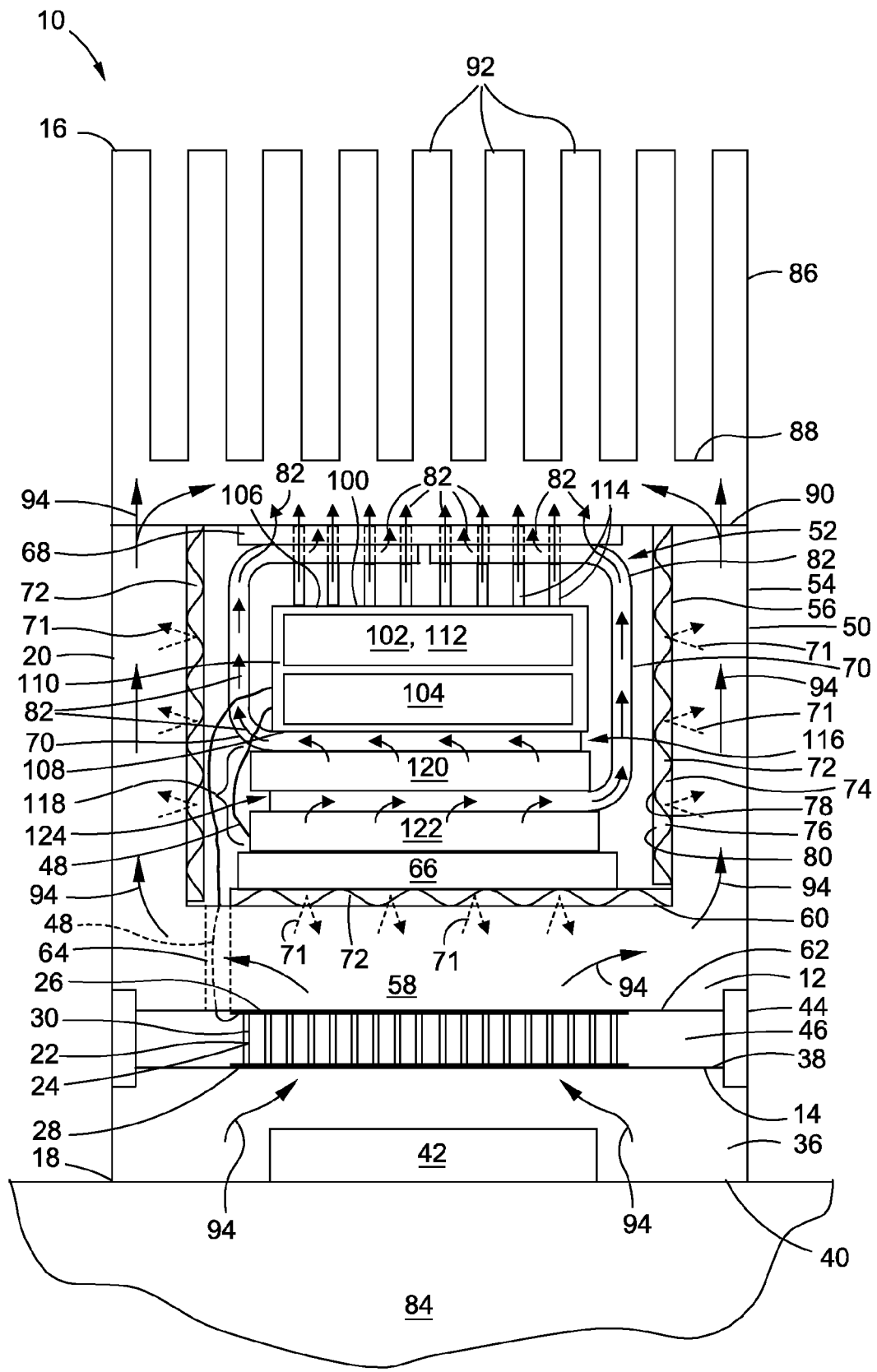
FIG. 3 is a side sectional view of a further embodiment of a thermoelectric energy harvesting system having heat conducting pins extending from the electronics module toward the heat sink.

The system 10 may further include a heat sink 86 that may be mounted on top of the housing 50. The heat sink 86 may have a heat sink upper surface 88 and a heat sink lower surface 90. The heat sink upper surface 88 may include a plurality of cooling elements 92 for facilitating heat exchange with the environment. For example, the heat sink 86 may include a plurality of cooling fins or cooling pins extending upwardly from the heat sink 86 for radiative heat transfer and/or natural convective heat transfer into the ambient air of the surrounding environment or heat conduction via forced airflow. Although the cooling elements 92 are illustrated in FIG. 2-3 as generally parallel cooling pins protruding straight upwardly, the cooling pins may be splayed outwardly to provide increased distance between the cooling pins and to increase the heat-exchanging volume of the heat sink 86 which may improve the heat-rejecting capability of the heat sink 86. The base member 36, the housing 50, and the heat sink 86 may define a system heat path 94 along which heat may flow from the heat source 84 into the base member 36 and through the thermoelectric generator 24 and up through the housing 50 and into the heat sink 86. The electronics module 100 may be sized and configured such that the electronics module sides 110 are disposed in non-contacting relation to the inner surface of the housing 50 to minimize conductive heat transfer into the electronics module 100.

The heat sink lower surface 90, the housing side wall inner surface 56, and the housing bottom upper surface 60 may collectively enclose the cavity 52. The cavity 52 may contain one or more electronics modules 100. In the embodiment shown, the electronics module 100 may be communicatively coupled to the thermoelectric generator 24 by means of electrical wiring 48 such as a power line passing through an aperture 64 or hole that may be formed in the housing bottom 58. In an embodiment, the electronics module 100 may include power management electronics 102 for managing or conditioning the power provided by the thermoelectric generator 24. The conditioning of the power provided by the thermoelectric generator 24 may include voltage rectification, voltage stabilization, providing protection against excessively high voltage or excessively low voltage, boosting the voltage produced by the thermoelectric generator 24, power matching, energy storage, and other power conditioning operations.

In an embodiment, the power management electronics 102 may be specifically configured to regulate the voltage produced by the thermoelectric generator 24. For example, power management electronics 102 may provide voltage within a predetermined voltage range to a load such as a wireless sensor. In an embodiment, the electronics module 100 may include a battery 118, a capacitor, or a super capacitor for storing electricity generated by the thermoelectric generator 24. The battery 118 may include a battery element 120 for storing power and/or a battery circuit board 122 for managing electrical energy stored by the battery element 120. The battery circuit board 122 may also mechanically support the battery element 120.

In a further embodiment, the electronics module 100 may additionally include an application-specific module 104. For example, an application-specific module 104 may be provided for any one of a variety of different applications including, but not limited to, remote sensing, data logging/recording/storage, signal processing, computational resources, wireless communication circuitry, or other applications. In an embodiment, the application-specific module 104 may be configured similar to the arrangement disclosed in U.S. application Ser. No. 12/316,034 published on Jun. 10, 2010 and entitled FIELD-DEPLOYABLE ELECTRONICS PLATFORM HAVING THERMOELECTRIC POWER SOURCE AND ELECTRONICS MODULE to Hofmeister et al., the entire contents of which is incorporated by reference herein. In an embodiment, the system 10 disclosed herein may be configured in a radio frequency identification (RFID) embodiment to facilitate recordation and/or storage of sensor data using the power supplied by the internal thermoelectric generator 24 with data extraction performed by power supplied by an external RF source (not shown). However, the system 10 disclosed herein may be configured for implementation in any one of a variety of different applications and is not limited to an RFID embodiment for remote sensing.

Referring still to FIG. 2, the system 10 may advantageously include a radiation shield 72 mounted along one or more of the inner surfaces of the cavity 52 to minimize radiative heating 71 of the electronics module 100. In the embodiment shown, the radiation shield 72 may be installed or mounted on the housing bottom upper surface 60 and/or on the housing side wall inner surface 56. The radiation shield 72 may be mounted to the housing side wall inner surface 56 and may extend around an inner circumference of the housing side wall 54. Likewise, a radiation shield 72 may be mounted to a substantial portion of the housing bottom upper surface 60. The radiation shield 72 may be specifically configured to block, prevent, reduce, minimize, or otherwise eliminate radiative heating 71 of the cavity 52 that may otherwise occur in response to the heat flowing through the housing 50 along the system heat path 94. The radiation shield 72 may retard or reduce radiative heat transfer into the cavity 52 which may otherwise cause heating of the electronics module 100.

The radiation shield 72 may be formed of a core 74 material such as a sheet or layer of foam, paper, aramid, or other material having a relatively low thermal conductivity. The core 74 may include a low-emissivity coating 78 applied to at least one side of the core 74. For example, the core 74 may include a low-emissivity metallic 80 coating such as an aluminum coating that may be applied to at least one side of the core 74 or to both sides of the core 74. In an embodiment, the core 74 may be provided in a corrugated configuration 76 having opposing face sheets (not shown) mounted to opposing sides of the corrugated core 76. A low-emissivity coating 78 such as a metallic 80 coating (e.g., aluminum) may be applied to one or both of the opposing face sheets. Advantageously, in any of the embodiments disclosed herein, the radiation shield 72 may be configured to function as a thermally reflective layer to reflect heat within the housing 50. In this manner, the radiation shield 72 may significantly reduce radiative heating 71 of the cavity 52 which may otherwise add to the heating of the electronics module 100.

The system 10 may further include a compliant thermally-insulative layer 66 that may be mounted within the cavity 52. For example, a compliant thermally-insulative layer 66 may be mounted on top of the radiation shield 72 of the housing bottom 58. The electronics module 100 may be mounted on top of the compliant thermally-insulative layer 66. The compliant thermally-insulative layer 66 may be compliant in the sense that the compliant thermally-insulative layer 66 may mechanically comply or conform to the surface contours of the electronics module lower surface 108 and/or the housing bottom upper surface 60. In addition, the compliant thermally-insulative layer 66 may be compliant in the sense that the compliant thermally-insulative layer 66 is resiliently compressible to absorb vibration, shock, and other mechanical movement of the electronics module 100. The resilient compressibility of the compliant thermally-insulative layer 66 may also urge the electronics module 100 upwardly into thermal contact with the heat sink 86 and/or into thermal contact with a compliant thermal transfer pad 68 that may be mounted between the electronics module upper surface 106 and the heat sink lower surface 90 to improve the drawing of heat out of the electronics module 100 as described in greater detail below.

In an embodiment, the compliant thermally-insulative layer 66 may be formed of material having a relatively high thermal insulative capability. For example, the compliant thermally-insulative layer 66 may be formed of a thermally insulative silicone-based material. In an embodiment, the compliant thermally-insulative layer 66 may be formed from a sheet of silicone rubber or silicone foam having a relatively high insulative capability. The foam may comprise a resiliently compressible silicone-based foam rubber. In this regard, the compliant thermally-insulative layer 66 may be formed of a resiliently compressible foam material and configured such that heat conducting pins 114 of the electronics module 100 shown in FIG. 3 may be maintained in substantially contacting relation with the heat sink lower surface 90 as described in greater detail below.

In FIG. 2, the system 10 may further include a mechanically-resilient or compliant thermal transfer pad 68 configured to substantially conform to the heat sink lower surface 90. The compliant thermal transfer pad 68 may facilitate thermal coupling of the electronics module 100 to the heat sink 86 for conductive heat transfer therebetween. In the embodiment shown, the system 10 may further include a compliant thermally-conductive layer 70 that may be sandwiched between the electronics module upper surface 106 and the compliant thermal transfer pad 68 to provide a direct heat conduction path 82 between the electronics module 100 and the heat sink 86 as described in greater detail below.

The compliant thermal transfer pad 68 may be formed of a material having a relatively high thermal conductivity, relatively low thermal resistance, and relatively high electrical insulative capability. For example, the compliant thermal transfer pad 68 may be formed of a silicone-based material filled with a highly-thermally conductive material such as alumina powder in a silicone matrix as may be commercially available from Laird Technologies, Inc. of St. Louis, Mo., or commercially available from Berquist, Inc. of Chanhassen, Minn. Alternatively, the compliant thermal transfer pad 68 may be formed of graphite sheet sandwiched between thin plastic or electrically-insulative layers or coatings. In an embodiment, the compliant thermal transfer pad 68 may be formed of metal foil (e.g., copper foil) that may be coated with or sandwiched between an electrically-insulating coating such as silicone. Such compliant thermal transfer pad 68 may include adhesive on one or both sides to adhesively bond the compliant thermal transfer pad 68 to the electronics module 100 and/or the heat sink 86. The compliant thermal transfer pad 68 may be coupled to the heat sink lower surface 90 by adhesive bonding such as with a pressure sensitive adhesive. Alternatively, the compliant thermal transfer pad 68 may be mechanically coupled to the heat sink 86. Advantageously, the compliant thermal transfer pad 68 may improve thermal sinking of the electronics module 100 to draw heat from the electronics module 100 into the heat sink 86.

The system 10 may further include a compliant thermally-conductive layer 70 that may extend between the electronics module lower surface 108 and up along the electronics module side 110 to the heat sink 86 to form a heat conduction path 82 therebetween. For example, in FIG. 2, a horizontal section of the compliant thermally-conductive layer 70 may be sandwiched between the battery 118 and the electronics module lower surface 108 at an electronics board-battery interface 116. A vertical section of the compliant thermally-conductive layer 70 may extend upwardly along a side (e.g., a left-hand side—FIG. 2) of the electronics module 100 within the gap between the electronics module side 110 and the radiation shield 72. A horizontal section of the compliant thermally-conductive layer 70 may be sandwiched between the compliant thermal transfer pad 68 and the electronics module upper surface 106. The compliant thermally-conductive layer 70 may be formed of a material that is highly thermally conductive such that a direct and substantially continuous or uninterrupted heat conduction path 82 is formed from the electronics module lower surface 108 and/or battery 118 up to the heat sink 86.

In a further embodiment, the system 10 may include a compliant thermally-conductive layer 70 having a horizontal section that may be sandwiched between the battery element 120 and the battery board 122 (e.g., circuit board) at a battery element-battery board interface 124. A vertical section of the compliant thermally-conductive layer 70 may extend upwardly along a side (e.g., a right-hand side—FIG. 2) of the electronics module 100. A horizontal section of the compliant thermally-conductive layer 70 may be sandwiched between the compliant thermal transfer pad 68 and the electronics module upper surface 106 to form a direct and substantially continuous heat conduction path 82 from the battery element-battery board interface 124 up to the heat sink 86. The compliant thermally-conductive layer 70 may be adhesively bonded to the compliant thermal transfer pad 68. Alternatively, the compliant thermal transfer pad 68 may be omitted and the compliant thermally-conductive layer 70 may be mounted directly to the heat sink lower surface 90 such as by adhesive bonding or by mechanical attachment or any combination thereof.

Referring to FIG. 3, shown is an alternative embodiment of the system 10 having a plurality of heat conducting pins 114 that may extend generally upwardly from the electronics module upper surface 106. For example, the electronics module 100 may include an electronics circuit board 112 which may contain heat conducting pins 114 extending upwardly from high heat locations on the electronic circuit board or in locations containing heat-sensitive components. The heat conducting pins 114 may extend at least partially into a thickness of the compliant thermal transfer pad 68.

Alternatively, the heat conducting pins 114 may extend substantially completely through the thickness of the compliant thermally-conductive layer 70 and/or through the thickness of the compliant thermal transfer pad 68. In an embodiment, the heat conducting pins 114 may be spring-loaded (not shown) such that the heat conducting pins 114 are maintained in substantially continuous and direct contact with the heat sink lower surface 90 to improve thermal transfer. Advantageously, the resiliently compressible compliant thermally-insulative layer 66 upon which the electronics module 100 may be mounted may provide upward urging of electronics module 100 which may facilitate mechanical contact of the heat conducting pins 114 with the heat sink lower surface 90.

In an alternative embodiment not shown, the system 10 may include a plurality of heat sink extensions (not shown) or protrusions that may extend generally downwardly from the heat sink lower surface 90. Such heat sink extensions may extend through the compliant thermal transfer pad 68 and through the compliant thermally-conductive layer 70 into contact with the electronics module upper surface 106. The heat sink extensions may improve heat conduction from the electronics module 100 into the heat sink 86.

Figure 4:
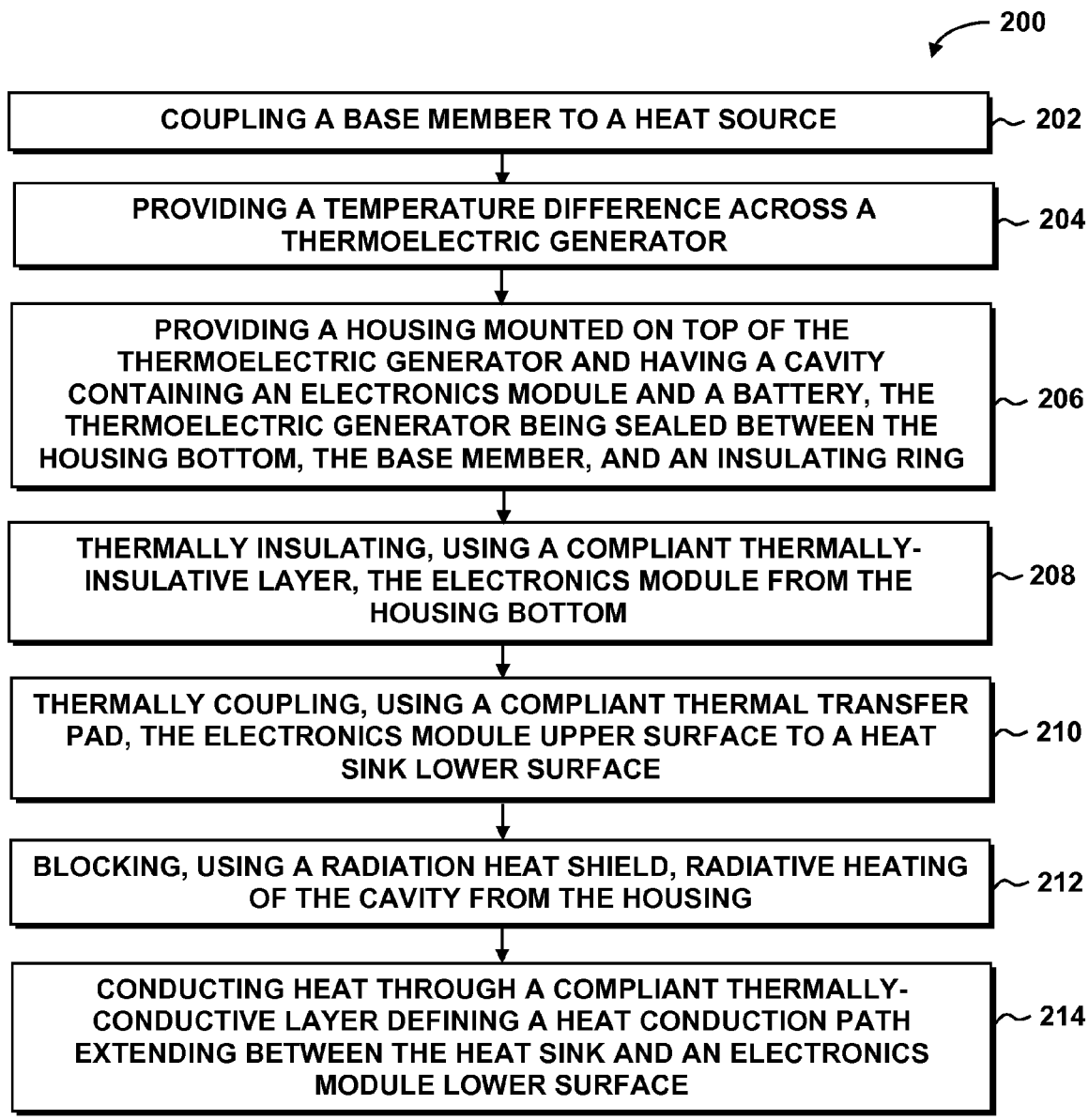
FIG. 4 is a flow diagram having one or more operations that may be included in a method of minimizing the heating of the electronics module of the thermoelectric energy harvesting system.

Referring to FIG. 4, shown is a method 200 that may be implemented for minimizing the heating of the electronics module 100 contained within the thermoelectric energy harvesting system 10. Step 202 of the method may include coupling the base member 36 to the heat source 84 such as by magnetic coupling using a magnet 42 that may be mounted within the base member 36. The base member 36 may be structurally coupled to the housing 50 using a thermal insulating ring 44 as described above.

Step 204 of the method 200 of FIG. 4 may include providing a temperature difference across the thermoelectric generator 24. When the heat source 84 is at a higher temperature than the heat sink 86, heat may flow along a system heat path 94 from the base member 36 across the thermoelectric generator 24 and into the housing 50. The heat may pass into the heat sink 86 whereupon the heat may be the radiated or convectively transferred to the environment by means of cooling elements 92 such as cooling pins or cooling fins protruding from the heat sink 86.

Step 206 of the method 200 of FIG. 4 may include providing the housing 50 with a cavity 52 for mounting the electronics module 100. The cavity 52 may be sized and configured such that the electronics module sides 110 are disposed in non-contacting relation with the housing side wall inner surfaces 56. The housing 50 may be mounted above the thermoelectric generator 24 and in direct thermal and physical contact therewith. The housing 50 may have heat flowing along the system heat path 94 as shown in FIG. 2.

Step 208 of the method 200 of FIG. 4 may include thermally insulating the electronics module 100 from the housing bottom 58 using the compliant thermally-insulative layer 66. As described above, the compliant thermally-insulative layer 66 may be formed of a resiliently compressible material. The resiliently compressible material of the compliant thermally-insulative layer 66 may bias or urge the electronics module upper surface 106 upwardly into thermal contact with the heat sink lower surface 90. For example, the compliant thermally-insulative layer 66 may urge the electronics module upper surface 106 into compressive contact with the compliant thermally-conductive layer 70 and with the compliant thermal transfer pad 68. In this manner, the combination of the compliant thermally-insulative layer 66, compliant thermally-conductive layer 70, and the compliant thermal transfer pad 68 may improve thermal conduction of heat from the electronics module 100 into the heat sink 86.

Step 210 of the method 200 of FIG. 4 may include thermally coupling the electronics module 100 to the heat sink 86 using the compliant thermal transfer pad 68. As described above, the compliant thermal transfer pad 68 may facilitate conduction of heat from the electronics module 100 into the heat sink lower surface 90. In addition, the mechanical compliance of the compliant thermal transfer pad 68 may improve the thermal contact between the heat sink 86 and the compliant thermally-conductive layer 70.

Step 212 of the method 200 of FIG. 4 may include reducing, minimizing, preventing, or eliminating radiative heating 71 of the cavity 52 from the heat within the housing 50 by including a radiation shield 72 along at least a portion of the housing side wall inner surfaces 56. For example, the radiation shield 72 may be applied to a substantial portion of an inner circumference of the housing side wall inner surface 56. In addition, a radiation shield 72 may be applied to the housing bottom upper surface 60 to reduce or retard radiative heating 71 of the cavity 52 from heat in the housing bottom 58.

Step 214 of the method 200 of FIG. 4 may include conducting heat through the compliant thermally-conductive layer(s) 70 extending between the heat sink 86 and the electronics module 100. As described above, the system 10 may include one or more compliant thermally-conductive layers 70 mounted to the electronics module 100 to form one or more direct heat conduction paths 82 to the heat sink 86. For example, heat may be conducted through a compliant thermally-conductive layer 70 to define a direct heat conduction paths 82 between the heat sink 86 and the battery 118.

Advantageously, the radiation shield 72 may limit or minimize the amount of radiative heating 71 of the cavity 52 which may prevent overheating of sensitive electronic components contained within the housing 50. Furthermore, the compliant thermal transfer pad 68 and the compliant thermally-conductive layers 70 may advantageously provide direct heat conduction paths 82 from the electronics module 100 to the heat sink 86 to improve cooling of sensitive electronics. In this regard, the radiation shield 72, the compliant thermal transfer pad 68, and the compliant thermally-conductive layers 70, operating alone or in combination with one another, may advantageously maintain the electronics module 100 below a maximum rated temperature (e.g., 65° C.) of such electronics module 100. In this manner, the system 10 and method disclosed herein may improve the operating efficiency of the thermoelectric generator 24 and electronics module 100. In addition, by maintaining the electronics module 100 below a predetermined temperature or maximum rated temperature, the operating life of the electronics module 100 may be extended.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. A thermoelectric energy harvesting device, comprising:
   a thermoelectric generator having a thermoelectric generator upper surface and producing a voltage in response to a temperature difference across the thermoelectric generator, the thermoelectric generator generating power when coupled to a load;
   a housing, the housing having a housing bottom defined by a housing bottom lower surface and a housing bottom upper surface located above the housing bottom lower surface, the housing bottom lower surface mounted on top of the thermoelectric generator and thermally coupled to and directly contacting the thermoelectric generator upper surface, the housing including a cavity enclosed by the housing bottom upper surface at a bottom of the cavity and an inner surface of a housing side wall circumscribing the cavity, the cavity being located above and physically separated from the thermoelectric generator by the housing bottom;
   a heat sink in direct contact with the housing side wall and enclosing a top of the cavity on an end thereof opposite the thermoelectric generator and configured to cause heat to flow from the thermoelectric generator upwardly through the housing side wall along a system heat path into the heat sink in response to the temperature difference across the thermoelectric generator;
   wherein the housing is sandwiched between the heat sink and the thermoelectric generator
   an electronics module mounted within the cavity and positioned above the housing bottom upper surface and having an electronics module upper surface thermally coupled to a heat sink lower surface, the electronics module conditioning the power generated by the thermoelectric generator and
   the housing side wall extending as a continuous surface circumscribing the cavity such that the electronics module is protected from exposure to moisture, mechanical impact, and excessive heat.

2. The device of claim 1, further comprising:
   a radiation shield covering at least a portion of a surface of the cavity and blocking radiative heating of the cavity from the housing.

3. The device of claim 2, wherein:
   the surface of the cavity includes at least one of the housing side wall inner surface and the housing bottom upper surface.

4. The device of claim 2, wherein:
   the radiation shield has a low-emissivity metallic coating.

5. The device of claim 2, wherein:
   the radiation shield has a corrugated configuration.

6. The device of claim 1, further comprising:
   a thermally-insulative layer positioned on top of the housing bottom upper surface; and
   the electronics module being mounted on top of the thermally-insulative layer.

7. The device of claim 1, further comprising:
   a thermally-conductive layer extending from an electronics module lower surface and up along an electronics module side to the heat sink and forming a heat conduction path between the electronics module and the heat sink.

8. The device of claim 7, further comprising:
   a mechanically-resilient thermal transfer pad substantially conforming to and thermally coupling the heat sink lower surface and the electronics module upper surface.

9. The device of claim 1, further comprising:
   a plurality of heat conducting pins extending outwardly from the electronics module upper surface and thermally coupling the electronics module to the heat sink.

10. The device of claim 1, further comprising:
    a base member mounted under the housing; and
    the thermoelectric generator being positioned between the base member and the housing.

* * * * *